(12) United States Patent
Wernersson et al.

(10) Patent No.: US 8,330,143 B2
(45) Date of Patent: Dec. 11, 2012

(54) SEMICONDUCTOR NANOWIRE TRANSISTOR

(75) Inventors: Lars-Erik Wernersson, Lund (SE);
Tomas Bryllert, Pasadena, CA (US);
Erik Lind, Lund (SE); Lars Samuelson, Malmö (SE)

(73) Assignee: QuNano AB, Lund (SE)

( * ) Notice: Subject to any disclaimer, the term of this patent is extended or adjusted under 35 U.S.C. 154(b) by 712 days.

(21) Appl. No.: 11/922,243

(22) PCT Filed: Jun. 16, 2006

(86) PCT No.: PCT/SE2006/050204
§ 371 (c)(1),
(2), (4) Date: Sep. 2, 2009

(87) PCT Pub. No.: WO2006/135336
PCT Pub. Date: Dec. 21, 2006

(65) Prior Publication Data
US 2009/0321716 A1   Dec. 31, 2009

(30) Foreign Application Priority Data
Jun. 16, 2005   (SE) .................................. 0501376-8

(51) Int. Cl.
*H01L 29/06* (2006.01)
*H01L 31/00* (2006.01)
(52) U.S. Cl. ... 257/24; 257/192; 257/401; 257/E29.134; 257/E29.135; 257/E29.07
(58) Field of Classification Search .................. None
See application file for complete search history.

(56) References Cited

U.S. PATENT DOCUMENTS

| | | | |
|---|---|---|---|
| 2002/0172820 A1* | 11/2002 | Majumdar et al. | 428/357 |
| 2003/0132461 A1 | 7/2003 | Roesner et al. | |
| 2004/0214786 A1 | 10/2004 | Hofmann et al. | |
| 2005/0029654 A1* | 2/2005 | Mio et al. | 257/734 |

FOREIGN PATENT DOCUMENTS

| | | |
|---|---|---|
| DE | 10324752 A1 | 1/2005 |
| JP | 61276265 A | 12/1986 |
| JP | 09307097 A | 11/1997 |
| KR | 10-2005-0042774 A | 5/2005 |
| WO | WO 2004/004927 A2 | 1/2004 |
| WO | 2004040668 A | 5/2004 |
| WO | WO 2005/064664 A1 | 7/2005 |

OTHER PUBLICATIONS

U.S. Appl. No. 11/922,242, filed Jun. 16, 2006, Wernersson et al.

(Continued)

*Primary Examiner* — Evan Pert
*Assistant Examiner* — Leslie Pilar Cruz
(74) *Attorney, Agent, or Firm* — The Marbury Law Group PLLC

(57) ABSTRACT

A nanowire wrap-gate transistor is realized in a semiconductor material with a band gap narrower than Si. The strain relaxation in the nanowires allows the transistor to be placed on a large variety of substrates and heterostructures to be incorporated in the device. Various types of heterostructures should be introduced in the transistor to reduce the output conductance via reduced impact ionization rate, increase the current on/off ratio, reduction of the sub-threshold slope, reduction of transistor contact resistance and improved thermal stability. The parasitic capacitances should be minimized by the use of semi-insulating substrates and the use of cross-bar geometry between the source and drain access regions. The transistor may find applications in digital high frequency and low power circuits as well as in analogue high frequency circuits.

12 Claims, 5 Drawing Sheets

OTHER PUBLICATIONS

Hareland, S. A., et al., "New Structural Approach for Reducing Punchthrough Current in Deep Submicrometre MOSFETs and Extending MOSFET Scaling," Electronics Letters, IEE Stevenage, GB, vol. 29, No. 21, Oct. 14, 1993, pp. 1894-1896, ISSN: 0013-5194.

European Search Report, EP National Stage of Application PCT/SE2006/050204, May 6, 2009, 7 pages.

European Search Report, Application No. EP 11 17 5291, Jan. 24, 2012, 10 pages.

\* cited by examiner

*Fig. 1a-c (Prior Art)*

SEMICONDUCTOR NANOWIRE TRANSISTOR

CROSS-REFERENCE TO RELATED APPLICATIONS

This application is a National Stage application of PCT/SE2006/050204, filed Jun. 16, 2006, which claims priority from Sweden application SE 0501376-8, filed Jun. 16, 2005.

TECHNICAL FIELD

The present invention relates to a transistor device of nanoscale dimensions. In particular the invention relates to a wrap gate field effect transistor with a nanowire or nanowires as an essential member in the current path.

BACKGROUND

Semiconductor materials with narrow band gap, hereinafter referred to as III/V semiconductors, such as InAs and InSb, have high mobilities, high saturated carrier velocities and low contact resistances. This makes the materials good candidates for high-speed and low-power electronics, and over the recent years the interest in using these materials in a large variety of semiconductor devices has shown a significant increase. However, transistors made of these materials often suffer from poor current control, small current on/off ratios, strong thermal effects, and a large output conductance related to the narrow band gap. In addition, structures of III/V semiconductors should preferably, in order to be commercially interesting, be compatible with existing silicon based technology, for example be possible to fabricate on Si-substrates. This is, with conventional technology, difficult, due to the large lattice mismatch between Si and III/V semiconductor materials. These above mentioned effects limit the application areas of the III/V semiconductors devices and reduce the performance of analogue and digital applications. FIGS. 1a-c shows data for an InAs nanowire transistor, suffering from the above mentioned limitations: a) illustrates poor current control, b) the threshold control and c) the insufficient current on/off ratio.

In a typical planar Field Effect Transistor (FET) the source-drain current is confined to a planar layer of semiconductor material. This means that it is not possible to use heterostructures in the direction of the current path in the channel to improve the performance, as is done in vertical, for instance bipolar, transistors. It is also difficult to fabricate heterostructures with narrow bandgap materials: in III/V semiconductors due to the lack of suitable lattice matched materials and problems with Sb-based compounds, and for Ge, the large lattice mismatch to Si and SiC.

The growth of nanowires offers new possibilities in heterostructure design as radial strain relaxation allows a large range of new compositions to be fabricated. InP can, for example, be grown on InAs without defects as described by Samuelson et al., United States Patent Application US 2004/0075464 A1. It is also possible to use a substrate that is not lattice matched to the wires, which offers even more design flexibility and opens up a route to integrate III-V semiconductors on Si. Thus the above described problems can be mitigated by the use of devices of nanoscale dimensions.

Semiconductor nanowires is in this context defined as rod-shaped structures with a diameter less than 200 nm and a length up to several μm. The growth of semiconductor nanowires can be done in various ways, for example by Vapor Phase Epitaxi (VPE) using metal particles to assist the anisotropic growth as in the above referred US application to Samuelson et al.

In the nanowire geometry of the FET [Yazawa et al., U.S. Pat. No. 5,362,972] a nanowire field effect transistor is described. The gate surrounds the narrow nanowires providing good gate coupling and forming a wrap gate FET. The nanowires are homogenous GaAs whiskers grown by a vapour phase method.

The prior art nanowire transistor illustrates the potential of using the semiconductor nanowires. However, the experimental findings, for example with regards to $I_{on}/I_{off}$, impact ionization rate etc, indicate that improvements are necessary before commercially attractive devices can be offered. Contacts to semiconductor devices is an area of special concern, as the contact resistance reduces speed and output power, but increases power consumption.

SUMMARY OF THE INVENTION

Obviously the prior art Wrap gate FET transistors needs significant improvements in order to function as the functional units in high-speed and low power electronics as envisaged.

The object of the present invention is to provide a wrap gate FET transistor that overcomes the drawbacks of the prior art transistors. This is achieved by the device as defined in claim 1.

According to the invention wrap insulating gate field effect transistor (WIGFET) based upon a semiconductor nanowire is provided. The current channel of the FET comprises of a semiconductor nanowire of a material with a first bandgap. A source contact is arranged on one end of the nanowire, and a drain contact is arranged on the opposite end. A wrap gate contact encloses a portion of the nanowire between the source contact and the drain contact and defines a gate region. The nanowire of the FET transistor according to the invention is provided with at least one heterostructure with at least one segment of a material with a second band gap, which differs from the band gap of the nanowire, the first band gap. At least one of the heterostructures should be in connection with one of the source contact, drain contact or gate contact.

According to one embodiment of the invention the heterostructure is provided in connection with the source contact and/or the drain contact to reduce the contact resistance between the nanowire and the contacts. Typically this is achieved by providing segments of a material with a narrower band gap than material of the nanowire. Metals-semiconductor contacts form a low barrier height for materials with a narrow band gap and hence it is attractive to employ these materials in device contacts, for example the source and drain contacts in the wrap gate FET.

According to another embodiment of the invention a heterostructure is introduced at least partly within the gate region, and hence effecting the active part of the transistor. The heterostructure comprises of one or more segments of material with a wider bandgap than the nanowire, and forms a barrier which properties can be varied in order to optimize different aspects of the performance of the transistor. The heterostructure can for example be introduced to reduced the impact ionization rate of the transistor, to improve the on/off current characteristics, and to reduce the effects of drain induced barrier lowering.

Thanks to the FET transistor according to the invention it is possible to provided high speed and low power electronic devices. The nanowire technique with heterostructure inclusions is well suited for industrial production.

One advantage of the FET according to the invention is that the transistor can be optimized for analog or ditigital applications by different selections of heterostructure segments within, or close to, the gate region of the nanowire.

A further advantage of the invention is that the performance of the FET can be improved in that the heterostructure(s) make it possible to reduced output conductance via decreased impact ionization rate, improved current on/off ratios, reduced gate voltage swing via reduced drain induced barrier lowering, reduced contact resistance, and increased thermal stability.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION

A wrap-gated nanowire transistors according to the invention is based on at least one vertical nanowire around which a gate is formed by post-growth processing and where an electrical field effect is used for the transistor action, in similarity with a conventional field effect transistor (FET). Materials with a band gap narrower than Si (like InAs, InSb, and the alloys of In, As, Ga, Sb and P) are preferably used in the nanowires in order to enhance the device properties via increased mobility and saturated electron velocity. The nanowires, which act as channels in the transistors, may have been grown using selective epitaxy where particles are used to assist the anisotropic growth. Chemical Beam Epitaxy or different types of Vapour Phase Epitaxy methods may be employed for the growth. Lithographic methods or metal particle deposition are used to define the metal particles and the size of the metal particle determines the diameter of the wires. Typically, diameters below 200 nm, with a standard deviation of 5%, can be fabricated. Wires only grow at the defined locations and the planar growth rate is negligible in this particle assisted growth mode. Suitable methods for growing nanowires on semiconductor substrates are described in US 2003/010244. Methods of providing epitaxially grown nanowires with heterstructures are to be found in US 2004/0075464.

Figure 1:
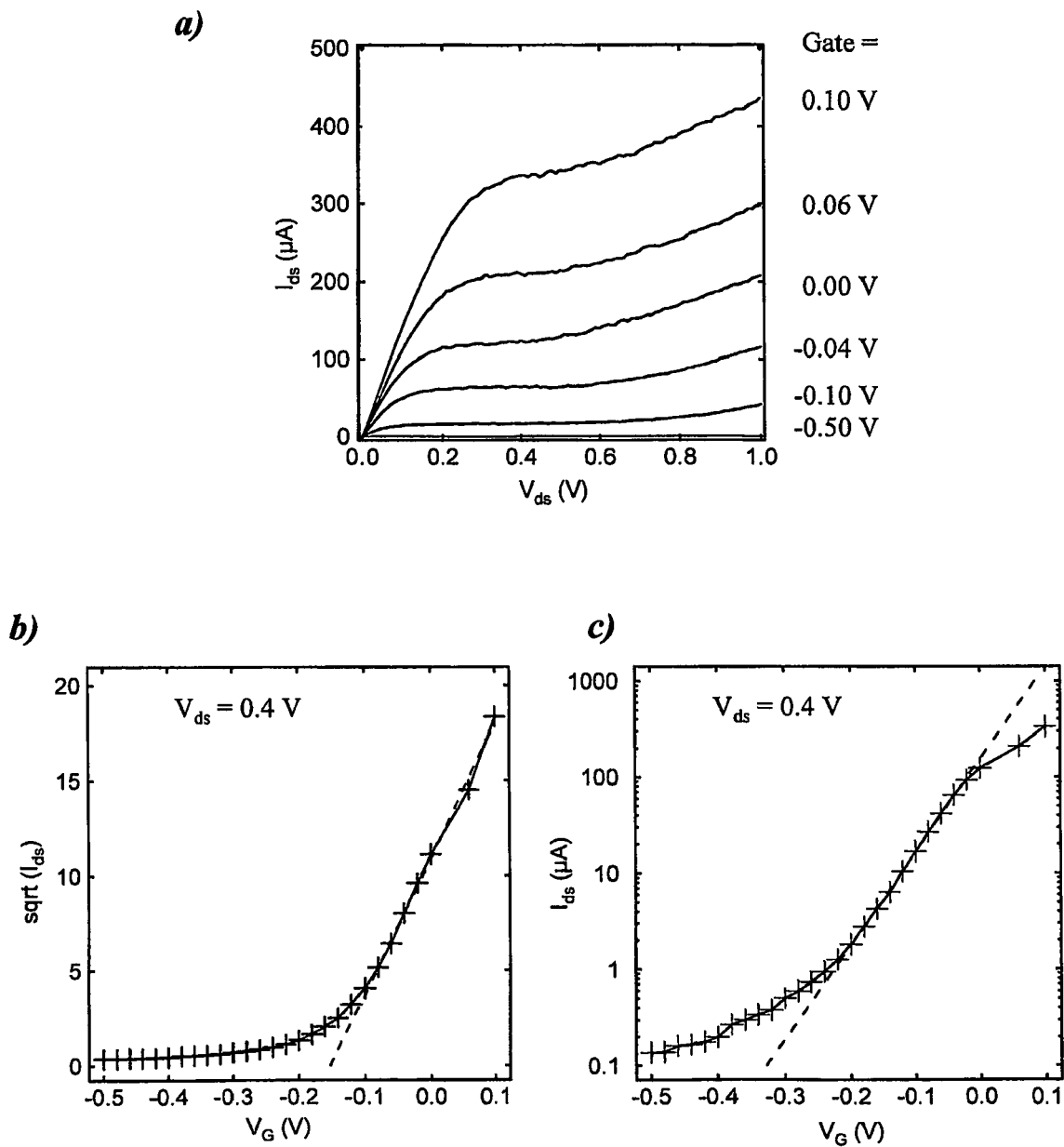
FIG. 1a-c illustrates room temperature IV characteristics of a prior art 1-μm-gate length InAs transistor with ~40 nanowires in parallel as a channel, b) plot of sqrt(Ids) vs VG to extract threshold voltage and c) sub-threshold characteristics with a 100 mV/decade slope over two orders of magnitude.
Figure 2:
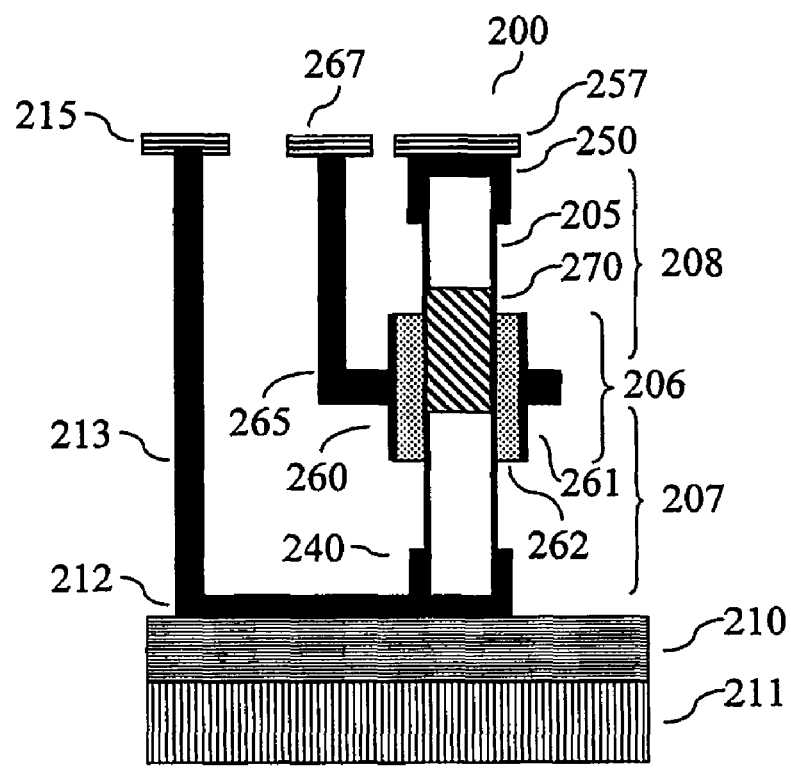
FIG. 2 illustrates schematically a cross-section of a vertical nanowire field effect transistor according to the present invention.

FIG. 2 illustrates the principle design of the wrap gate field effect transistor 200 according to the invention. A nanowire 205, typically of a III/V semiconductor, is provided as a channel. The material of the nanowire 205 has a bandgap, referred to as the nanowire bandgap, typically a relatively narrow bandgap. In one end of the nanowire a source contact 240 is provided and in the opposite end a drain contact 250. Between the source 240 contact and drain 250 contact is a gate contact 260 arranged. The gate contact 260 surrounds, or wraps, the nanowire 205, and covers a portion, the gate portion 206 of the nanowire 205. The portion between the middle of the gate portion 206 and the source contact 240 is referred to as the gate-source portion 207, and portion between the middle of the gate portion 206 and the drain contact 250 as the gate-drain portion 208. The drain contact 250 is connected to a drain contact pad 257. Alternatively no extra contact pad is needed and the drain contact serves as the connection point for external connections. The nanowire 205 has been grown on a substrate 210. The substrate 210 can be, for example, S.I. GaAs, S.I. InP, Si, n⁺-InP, or SOI. The substrate may be provided with a 2D epitaxial layer 211, such as n⁺⁺-InP, n⁺⁺-GaAs, n⁺⁺-Si, poly-Si etc to achieve low access resistance in the transistor. It may preferably be grown on a SI-substrate of InP or GaAs. The layer 211 may also be omitted. The substrate 210 may form the source contact 240. Alternatively, a dedicated source contact 240 in the form of a patterned layer 212 is provided on the substrate surface. The patterned layer may also have served to direct the growth of the nanowire during the growth process. The patterned layer 212 reduces parasitic capacitance of the gate contact and gate pad. Parts of the patterned layer 242 may be exchanged to a metal film to further reduce access resistance. The substrate 210, the optional epitaxial layer 211 and the patterned layer 212 forms a conductive region of the transistor 200. If it is required that all external electrical contacts are made in the same plane, pillars 213, ending with source contact pads 215 of conducting materials may be formed. The source contacting pads 215 arranged to be in the same plane as the drain contact pad 257. Alternatively the pillars may be used to access the drain in the same plane as the source contact 240. Both the drain contact and the source contact may preferably extend a portion on the outer cylindrical surface of the nanowire in order to ensure good electrical contact with the nanowire 205. The drain contact may be formed with an airbridge technology to reduce parasitics, but a chemically and mechanically stable layer from an insulating inorganic or organic film such as $SiN_x$ may be used as an insulator between the drain and substrate. This layer is etched away from the top of the wires before the top contact is formed. As an alternative to the depicted design, all external contacts can be made on the substrate side of the device, and consequently the gate contact 260 and the drain contact 250 will be connected through pillars, or similar structures, extending from the contacts to the plane defined by the upper surface of the substrate 210.

The gate contact 260 encloses the nanowire 205 and has a length of 5 to 500 nm. The gate contact 260 comprises of a conducting part 261 and an dielectric layer 262, typically 1-50 nm thick, which isolates the conducting part 261 of the gate contact 260 from the substrate and the nanowire 205. Hence, the type of transistor formed is a Metal Insulator Semiconductor Field Effect Transistor (MISFET). Given the wrap gate, the transistor according to the invention can be referred to as a Wrap Insulating Gate Field Effect Transistor (WIGFET). $SiN_x$ or $SiO_2$ may be used as insulator but different insulating materials including high-k dielectrics are possible. The insulating layer may be applied by a deposition method or by oxidation of a semiconducting layer, radially grown around the wire. It is also possible to use epitaxially grown semiconductor layers (core/shell nanowires) of a band gap that is wider than the band gap in the channel region to separate the gate from the channel, possibly in combination with an insulating layer. In this case the layout resembles a vertical Metal Semiconductor Field Effect Transistor (MESFET) or a vertical High Electron Mobility Transistor (HEMT).

The gate contact 260 is formed by a number of deposition and etch steps including, growth of wires on a semiconductor substrate, deposition of gate dielectric with controlled thickness, deposition of gate metal via sputtering, evaporation or chemical deposition, spin-on of organic film, etch-back of polymer to define gate length, and wet-etch of gate metal. After these steps the gate wraps around the base of the wire as is shown in FIG. 2. A gate contacting structure 265 is provided for external connection to the gate contact 260. Typically an preferably the contacting structure ends with a gate contact pad 267 in the same plane as the drain terminal 257. As appreciated by the skilled in the art, the above outlined procedure is exemplary, and alternative approach for providing a wrap gate are known to the skilled person.

The airbridge of the drain contact 260 is fabricated so that it wraps around the top of the wires. This gives a large contact area compared to the size of the current channel. A thin contact layer of Ti may be used to increase the adhesion of the metal to the semiconductor surface and to decrease the contact resistance.

For the purpose of this application the term contact is not limited to the preferably highly conductive material to which external voltage or current is applied, but also meant to include for example airbridges, insulator layers and an adhesive layer which are parts of the drain, source or gate contacts.

In the implementation shown in FIG. 2 only one active nanowire with wrap-gate is shown, but a number of nanowires can be placed in parallel and combined to a channel in the transistor to get the desired drive current and transconductance.

According to the invention at least one heterostructure 270 is provided in the nanowire 205. The material of the heterostructure should have a bandgap that differs compared to the bandgap of the material of the nanowire 205.

According to the invention the heterostructure should alter the properties of the nanowire in the proximity of at least one of the drain, source or gate contact, i.e. the heterostructure should be in connection with one of the contacts. A plurality of heterostructures, each with connection to one of the contacts may be provided. In addition heterostructures may be implemented also in parts of the nanowire 205 which in not adjacent to any of the contact. The various heterostructures, or combinations of them are introduced to optimize different aspects of the functionality of the transistor, which will be further described below. Methods to grow nanowires with heterostructure segments are known in the art, as described in the reference above.

Figure 3:
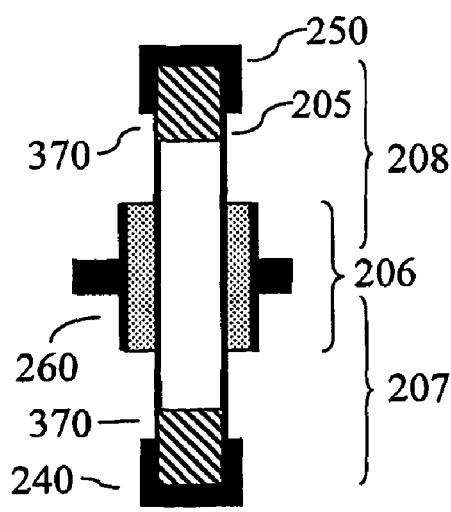
FIG. 3 illustrates schematically a cross-section of the core in a vertical nanowire field effect transistor according to a first embodiment of the present invention.

According to a first embodiment of the invention one heterostructure 370 is provided in connection with either the drain 250 or source contact 240, or alternatively two heterostructures 370 are provided, one in connection with the drain contact 250, and one with the source contact 240, as illustrated in FIG. 3. The heterostructure(s) 370 consists of a segment of a semiconductor material of different constitution than the adjacent part or parts of the nanowire 205. The material of the heterostructure segment(s) 370 has a narrower band gap than the nanowire (like InAs, InSb, InGaAs or Ge, or alloys containing Al, Ga, In, As, P). Suitable band gap for the segment range from 200 to 500 MeV and segment lengths from 50 to 300 nm. Suitable materials include, but is not limited to InAs, InSb and Ge and combinations and alloys thereof The heterojunction can either be abrupt or graded. The narrow band gap reduces the specific contact resistance to the transistor and improves the performance. These segments are preferably doped on a higher level than the other parts of the nanowire transistor to further reduce the contact resistance. The reduced contact resistance lowers the source-drain voltage required to reach the saturation region in the transistor characteristics. Besides the introduction of the segment during the growth of the nanowire, the processing of the transistor is the same as for the device with a homogeneous channel. This implementation for reduction in contact resistance may also be employed for nanowires that have a band gap comparable or larger than Si, like GaAs, InP, GaN, InN, and also Si.

Figure 4:
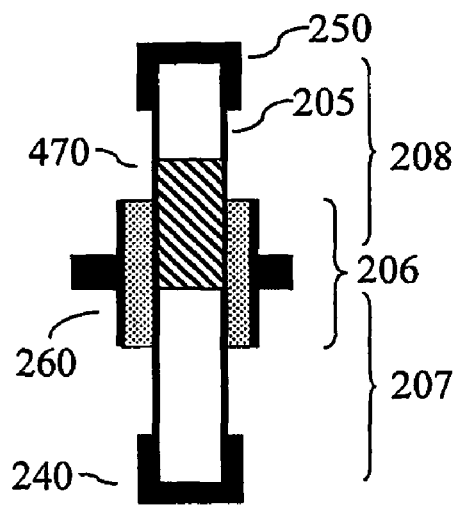
FIG. 4 illustrates schematically a cross-section of the core in a vertical nanowire field effect transistor according to a second embodiment of the present invention.

According to a second embodiment of the invention a heterostructure 470 is provided in the high-field region between the gate and the drain, i.e. the gate-drain portion 208, and extends in the direction of the drain outside of the gate contact 260, as illustrated in FIG. 4. The heterostructure comprises a segment (length 50 to 500 nm) of a semiconductor material with wider band gap ($\Delta E_g$ 100 meV to 2 eV) than the nanowire (like Si, SiGe, InP, GaAs, GaP, or alloys containing Al, Ga, In, As, P). Suitable materials include, but is not limited to InP, GaAs and AlAs and combinations and alloys thereof. The increased band gap reduces the impact ionization rate due to an increased band gap and/or a reduced electric field. The heterostructure may be either graded or abrupt.

Figure 5:
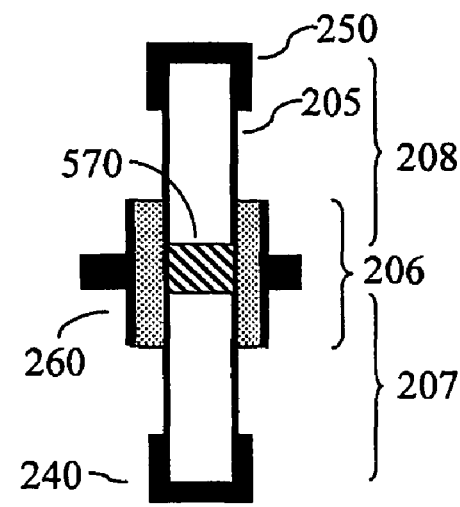
FIG. 5 illustrates schematically a cross-section of the core in a vertical nanowire field effect transistor according to a third embodiment of the present invention.

According to a third embodiment of the invention a heterostructure 570 is provided within the gate region 209, i.e. within the part of the nanowire enclosed by the wrap gate contact 260, as illustrated in FIG. 5. The heterostructure consists of a segment of a semiconductor material with wider band gap ($\Delta E_c$ 100 to 300 meV) than the nanowire (like Si, SiGe, InP, GaAs, GaP, or alloys containing Al, Ga, In, As, P). Suitable materials for the segment include, but is not limited to InP, GaAs and AlAs and combinations and alloys thereof. The increased band gap enhances the maximum barrier height ($\sim E_g$) that may be utilized for blocking the thermal current in the off-state of the transistor and increased the current on/off ratio. The heterojunction is sufficiently thick (>5 nm) to allow for diffusive-like transport (field assisted tunneling) across the interface. The heterojunction can either be abrupt or graded. The on-current still remains high due to tunneling and thermionic emission across the heterostructure interface. The introduction of the barrier may also be used to control the threshold voltage, $V_t$, of the transistor. The thermal stability of the device is related to the band gap of a device, since the intrinsic carrier concentration is proportional to $-E_g/2\,kT$. The introduction of a segment with wider band gap reduces the thermal effects to carrier concentrations well below the used doping levels, hence the thermal stability of the device is increased.

Figure 6:
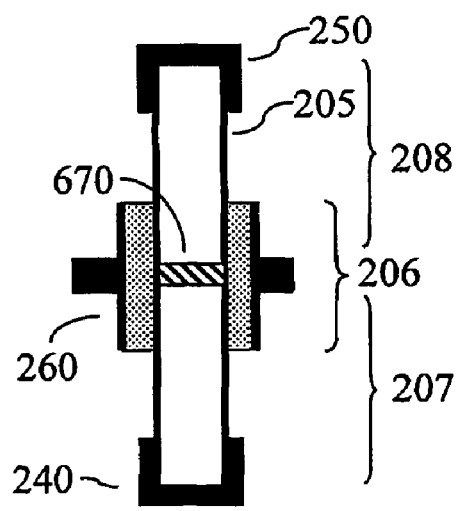
FIG. 6 illustrates schematically a cross-section of the core in a vertical nanowire field effect transistor according to a fourth embodiment of the present invention.

According to a fourth embodiment of the invention a heterostructure 670 is provided within the gate region 209 as illustrated in FIG. 6. The heterostructure consists of a segment of a semiconductor material with wider band gap ($\Delta E_c$ 300 meV to 1 eV) than the nanowire (like Si, SiGe, InP, GaAs, GaP, or alloys containing Al, Ga, In, As, P). The heterojunction is sufficient thin (<5 nm) to allow for quantum tunneling across the barrier. The increased band gap enhances the maximum barrier height ($\sim E_g$) that may be utilized for blocking the thermal current in the off-state of the transistor and increased the current on/off ratio. The heterojunction can either be abrupt or graded. The on-current still remains high due to tunneling and thermionic emission across the heterostructure interface.

Figure 7:
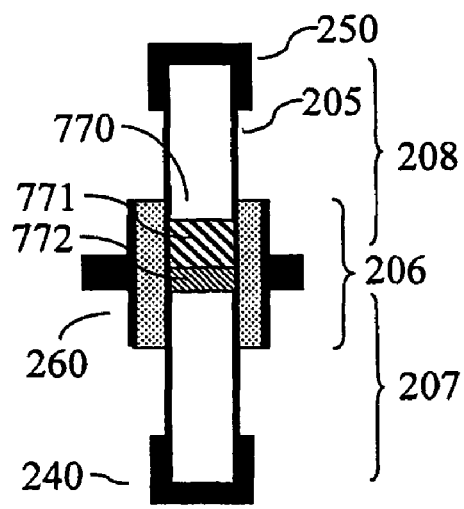
FIG. 7 illustrates schematically a cross-section of the core in a vertical nanowire field effect transistor according to a fifth embodiment of the present invention.

According to a fifth embodiment of the invention a heterostructure 770 comprising a plurality of segments 771, 772 is provided within the gate region 209 as illustrated in FIG. 7. The heterostructure comprises of several segments of semiconductor materials with wider band gap than the nanowire (like Si, SiGe, InP, GaAs, GaP, or alloys containing Al, Ga, In, As, P). The heterojunction comprises segments 772 of material width a band gap which is 100 meV to 1 eV ($\Delta E_c$) larger than the material of the nanowire 205 that are sufficient thin (<5 nm) to allow for tunneling across the barrier and thicker segments 771, $\Delta E_c$ 10 meV to 50 meV, that suppress the tunneling probability. The increased band gap enhances the maximum barrier height ($\sim E_g$) that may be utilized for blocking the thermal current in the off-state of the transistor and increased the current on/off ratio. The heterojunction can either be abrupt or graded. The on-current still remains high due to tunneling and thermionic emission across the heterostructure interfaces.

Figure 8:
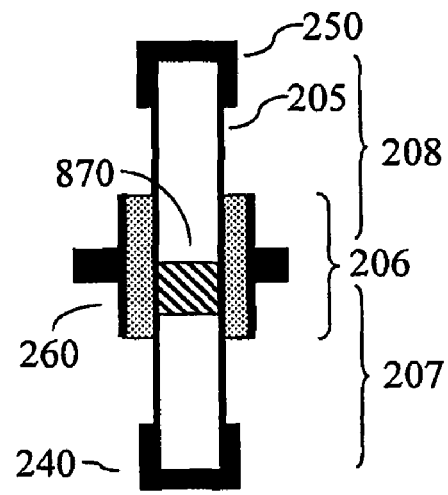
FIG. 8 illustrates schematically a cross-section of the core in a vertical nanowire field effect transistor according to a sixth embodiment of the present invention.

According to a sixth embodiment of the invention a heterostructure 870 is provided within the gate region 206 and within the gate-source portion 207 as illustrated in FIG. 8. The heterostructure consists of a segment of a semiconductor material with wider band gap than the nanowire (like Si, SiGe, InP, GaAs, GaP, or alloys containing Al, Ga, In, As, P). The heterojunction can either be abrupt or graded. The abrupt band offset in the heterostructure is not lowered by the drain induced electric field and provides a constant barrier. It reduces the impact of drain induced barrier lowering and increases the subthreshold slope of the transistor characteristics.

As mentioned, heterostructures can be introduced in the transistor channel, i.e. the nanowire 205, to optimize the transistor for different implementations. A transistor for RF analog operation, for example used for amplifying purposes, and a transistor for use in rapid low-powered logic circuits can be seen as two extreme cases of implementation of the transistor according to the invention. In the trade-off between high speed and low power operation in digital circuits, materials with a higher mobility allow a reduction in the supply voltages without loss of the circuit speed. The reduced supply voltage consequently lowers the circuit power consumption for a given operation. Alternatively, the materials properties are only used to enhance the speed performance of the, most likely analogue, circuits without consideration of the power consumption.

Figure 9:
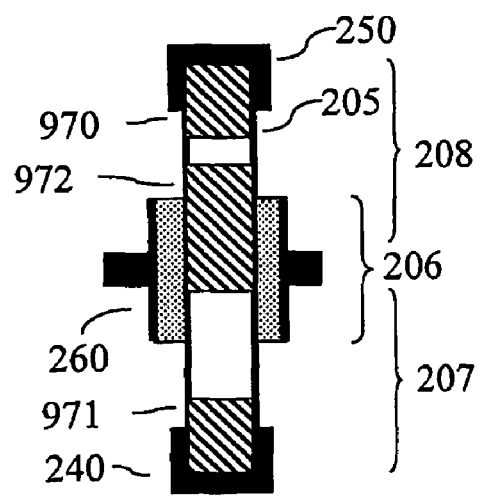
FIG. 9 illustrates schematically a cross-section of the core in a vertical nanowire field effect transistor optimized for analog operations.

In FIG. 9 is illustrated a WIGFET according to the invention optimized for analog applications. Segments of heterostructures 970, 971 with a narrower band gap are introduced at the source and drain region respectively to reduce the specific contact resistance. The segments of heterostructures 970, 971 preferably have material properties corresponding to the embodiment described with reference to FIG. 3. In the gate region, a segment 972 of wider band gap material is introduced in order to reduce the impact generation process in the high field region. The length of the segment is typically and preferably within 10 to 500 nm and the bandgap of semiconductor material of the segment 100 meV to 2 eV larger ($\Delta E_g$) than the nanowire. Suitable materials for the segment include, but is not limited to InP, GaAs and AlAs and combinations and alloys thereof. The segment is extending towards the drain region and has a composition that is matching the electrical field strength. This reduces the output conductance and allows for an increased drain bias in order to optimize the output power.

Figure 10:
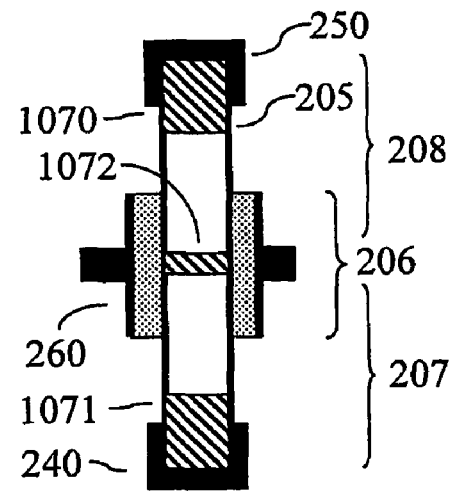
FIG. 10 illustrates schematically a cross-section of the core in a vertical nanowire field effect transistor optimized for digital operations.

In FIG. 10 is illustrated a WIGFET according to the invention optimized for digital operations Segments of heterostructures 1070, 1071 with a narrower band gap are introduced at the source and drain region respectively to reduce the specific contact resistance. The segments of heterostructures 1070, 1071 preferably have material properties corresponding to the embodiment described with reference to FIG. 3. In the gate region, a segment 1072 of wider band gap material is introduced in order to reduce to off-current and minimize the gate voltage swing required to reach a given current on/off ratio. The band gap of the material of the segment should preferably be in the order of 300 meV to 1 eV ($\Delta E_c$) larger than the nanowire. The segment should be made sufficiently thin (<5 nm) to allow for tunneling across the barrier, and suitable materials include, but is not limited to InP, GaAs and AlAs and combinations and alloys thereof.

Figure 11:
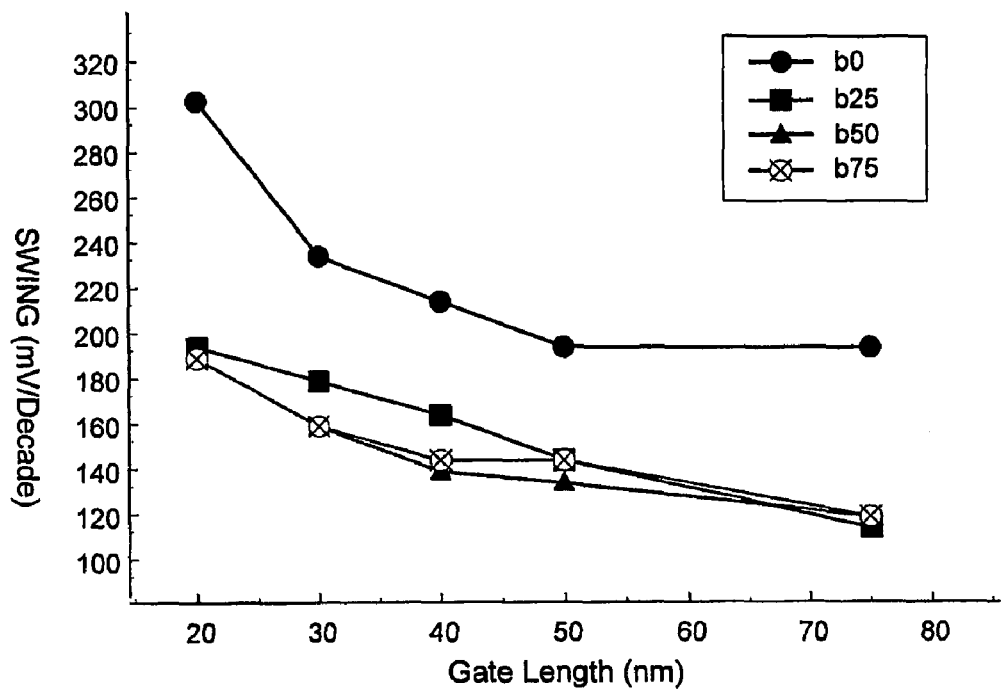
FIG. 11 Simulated subthreshold voltage swing demonstrating the effect of Drain-Induced Barrier Lowering and how the limitation can be reduced via the introduction of a barrier (b25, b50, b75) as compared to the device without a barrier (b0). Numbers in legend denote thickness of the barrier.

The introduction of a heterostructure in the form of at least one segment of a material with wider band gap than the nanowire 205 according to the invention effects the properties and characteristics of the field effect transistor in various ways, as exemplified in the above embodiments. In FIG. 11 the swing as a function of gate length is illustrated for segments of different length provided within the gate region 206, b0—no segment, b25—25 nm, b50—50 nm and b75—75 nm. The introduction of a barrier segment clearly reduces the swing for a given gate length. Hence, shorter gates can be used without impairing the performance, which is advantageous given the design constrains in the nanometer structure.

Figure 12:
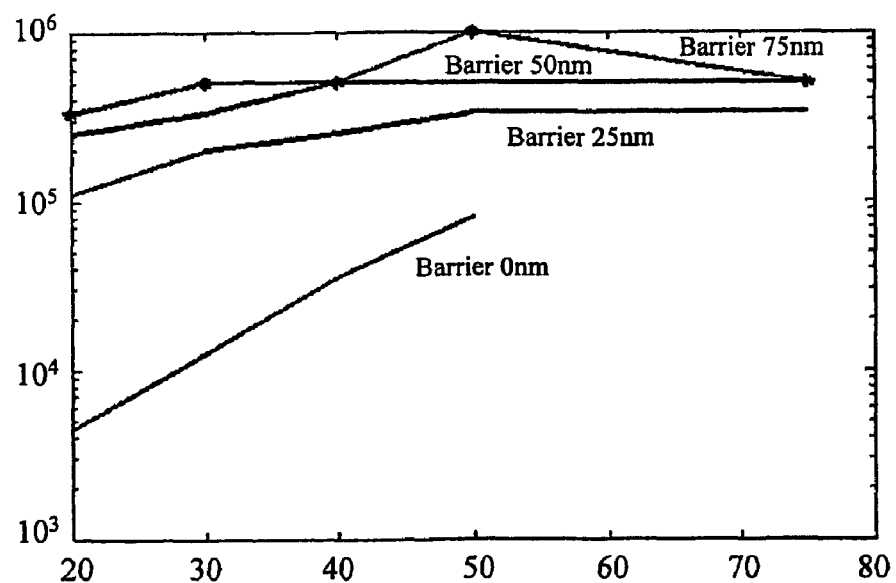
FIG. 12 Simulated Ion/Ioff ratios as a function of gate length demonstrating how the barrier increases the ratio and reduces the effects of changed gate lengths. Numbers in legend denote thickness of the barrier.

In FIG. 12 it is illustrated how the $I_{on}/I_{off}$ ratio is improved by the introduction of a barrier segment within the gate region 206.

In order to improve the RF-performance of the transistor, the parasitic capacitances and resistances must be reduced. In the described implementation, the gate length (t) is controlled by the deposition and etching conditions and not by the lithographic line width, which allows for scaling of the transistor by control of deposition and etching methods in contrast to conventional transistor design. The length of the source and drain regions are preferably optimized to reduce the parasitic gate-source and gate-drain capacitance, but at the same time the total length of the wire should be sufficient short to reduce the access resistance in the transistor. In particular the external contacting means, for example the conducting layer 212, the gate contacting structure 265, and the drain contacting structure 255, connecting to the source, drain and gate contacts 240, 250, 265 respectively, should be made as narrow as possible and placed in a cross-bar geometry where the overlay of the regions is minimized. These measures will minimize the parasitic capacitances.

The invention has mainly been described above with reference to a few embodiments. However, as is readily appreciated by a person skilled in the art, other embodiments than the ones disclosed above, including the change of source and drain regions, are equally possible within the scope of the invention, as defined by the appended patent claims. It should also be noted that the above embodiments may be combined in various ways to adapt the performance of the WIGFET to different applications.

The invention claimed is:

1. A wrap insulating gate field effect transistor comprising a nanowire of a material with a first bandgap forming the current channel of the transistor;
   a source contact arranged on one end of the nanowire;
   a drain contact arranged on the opposite end of the nanowire;
   a wrap gate contact enclosing a portion of the nanowire between the source contact and the drain contact, defining a gate region wherein the nanowire comprises at least one heterostructure with at least one segment of a material with a second bandgap, the second bandgap being different from the first bandgap, and the at least one heterostructure being in connection with one of the source contact, drain contact or gate contact,
   wherein the second bandgap is wider than the first bandgap.

2. The transistor according to claim 1, wherein the heterostructure is positioned at least partly within the gate region.

3. The transistor according to claim 1, wherein one heterostructure is positioned in connection with the source contact.

4. The transistor according to claim 1, wherein one heterostructure is positioned in connection with the drain contact.

5. The transistor according to claim 1, wherein external contacts connected to at least two of the source contact, drain contact or gate contact are arranged in a cross-bar geometry to reduce parasitic capacitance.

6. A wrap insulating gate field effect transistor comprising a nanowire of a material with a first bandgap forming the current channel of the transistor;
   a source contact arranged on one end of the nanowire;
   a drain contact arranged on the opposite end of the nanowire;
   a wrap gate contact enclosing a portion of the nanowire between the source contact and the drain contact, defining a gate region wherein the nanowire comprises at least one heterostructure with at least one segment of a material with a second bandgap, the second bandgap being different from the first bandgap, and the at least one heterostructure being in connection with one of the source contact, drain contact or gate contact,
   wherein at least one of the heterostructure is of a material with a narrower bandgap than the material of the nanowire and is provided to reduce the contact resistance between the nanowire and the source and/or drain contact.

7. The transistor according to claim 1, wherein at least one first heterostructure is positioned at least partly within the portion of the nanowire enclosed by the gate contact and a second heterostructure is positioned in connection with the source contact or in connection with the drain contact.

8. The transistor according to claim 1, wherein a segment or segments of larger band gap material is provided in the drain-gate region to reduce the impact ionization rate of the transistor.

9. The transistor according to claim 1, wherein a segment or segments of larger band gap material is provided in the source-gate region to reduce the impact ionization rate of the transistor.

10. The transistor according to claim 1, wherein a segment or segments of larger band gap material is provided in the drain-gate region to reduce the off-current of the transistor.

11. A wrap insulating gate field effect transistor comprising a nanowire of a material with a first bandgap forming the current channel of the transistor;
    a source contact arranged on one end of the nanowire;
    a drain contact arranged on the opposite end of the nanowire;
    a wrap gate contact enclosing a portion of the nanowire between the source contact and the drain contact, defining a gate region wherein the nanowire comprises at least one heterostructure with at least one segment of a material with a second bandgap, the second bandgap being different from the first bandgap, and the at least one heterostructure being in connection with one of the source contact, drain contact or gate contact,
    wherein a segment or segments of larger bandgap material is provided in the gate region to reduce drain induced barrier lowering of the transistor.

12. A wrap insulating gate field effect transistor comprising a nanowire of a material with a first bandgap forming the current channel of the transistor;
    a source contact arranged on one end of the nanowire;
    a drain contact arranged on the opposite end of the nanowire;
    a wrap gate contact enclosing a portion of the nanowire between the source contact and the drain contact, defining a gate region wherein the nanowire comprises at least one heterostructure with at least one segment of a material with a second bandgap, the second bandgap being different from the first bandgap, and the at least one heterostructure being in connection with one of the source contact, drain contact or gate contact,
    wherein the transistor is optimized for analog applications by providing:
    segments of heterostructures of a first material with a narrower band gap than the nanowire at the source and drain region respectively to reduce the specific contact resistance;
    at least one segment at least partly within the gate region and extending towards the drain region, the segment consisting of a second material with wider band gap than the material of the nanowire in order to reduce the impact generation process in the high field region.

* * * * *